(12) United States Patent
Henninger et al.

(10) Patent No.: US 12,072,073 B2
(45) Date of Patent: Aug. 27, 2024

(54) METHOD FOR MANUFACTURING LIGHT EMITTING ELEMENTS, LIGHT EMITTING ELEMENT, LIGHTING DEVICE AND AUTOMOTIVE HEADLAMP

(71) Applicant: LUMILEDS LLC, San Jose, CA (US)

(72) Inventors: Georg Henninger, Aachen (DE); Benno Spinger, Aachen (DE); Marcus Jozef Henricus Kessels, Echt (NL); Matthias Epmeier, Aachen (DE); Floris Maria Hermansz Crompvoets, Bunde (NL)

(73) Assignee: LUMILEDS, LLC, San Jose, CA (US)

( * ) Notice: Subject to any disclaimer, the term of this patent is extended or adjusted under 35 U.S.C. 154(b) by 0 days.

(21) Appl. No.: 17/673,520

(22) Filed: Feb. 16, 2022

(65) Prior Publication Data
US 2022/0260220 A1  Aug. 18, 2022

Related U.S. Application Data

(60) Provisional application No. 63/149,902, filed on Feb. 16, 2021.

(51) Int. Cl.
*F21S 41/151* (2018.01)
*F21K 9/68* (2016.01)
(Continued)

(52) U.S. Cl.
CPC .............. *F21S 41/151* (2018.01); *F21K 9/68* (2016.08); *F21S 41/148* (2018.01);
(Continued)

(58) Field of Classification Search
CPC ...... F21S 41/151; F21S 41/148; F21S 41/143; F21S 41/192; H01L 33/46; H01L 33/50; H01L 33/505; H01L 33/60
See application file for complete search history.

(56) References Cited

U.S. PATENT DOCUMENTS

| | | |
|---|---|---|
| 11,266,017 B2 | 3/2022 | Epmeier et al. |
| 2006/0214179 A1* | 9/2006 | Cao ................. F21K 9/232 257/E25.02 |

(Continued)

FOREIGN PATENT DOCUMENTS

| | | |
|---|---|---|
| EP | 3669118 | 6/2020 |
| WO | 2020/048766 | 3/2020 |
| WO | 2021/225804 | 11/2021 |

OTHER PUBLICATIONS

International Search Report and Written Opinion mailed on Jun. 3, 2022 for PCT International Application No. PCT/US2022/016604.

*Primary Examiner* — William N Harris
(74) *Attorney, Agent, or Firm* — Volpe Koenig

(57) ABSTRACT

A method for manufacturing light emitting elements is described and includes providing an un-coated light converting platelet. The un-coated light converting platelet has a top surface, a bottom surface, and side surfaces. A plurality of LED dies is provided. Side surfaces of the un-coated light converting platelet are coated with an at least partly reflective material to form a coated light converting platelet. The coated light converting platelet is separated into light converting tiles. An outline of the light converting tiles substantially corresponds to an outline of one of the plurality of LED dies. The light converting tiles and the plurality of LED dies are assembled to form light emitting elements.

15 Claims, 9 Drawing Sheets

(51) Int. Cl.
    *F21S 41/148*     (2018.01)
    *F21S 41/19*     (2018.01)
    *F21S 41/30*     (2018.01)
    *F21Y 103/10*     (2016.01)
    *F21Y 115/10*     (2016.01)
    *H01L 25/075*     (2006.01)
    *H01L 33/00*     (2010.01)
    *H01L 33/46*     (2010.01)
    *H01L 33/50*     (2010.01)
    *H01L 33/62*     (2010.01)
    *F21S 45/47*     (2018.01)

(52) U.S. Cl.
    CPC .............. *F21S 41/192* (2018.01); *F21S 41/30* (2018.01); *H01L 25/0753* (2013.01); *H01L 25/0756* (2013.01); *H01L 33/46* (2013.01); *H01L 33/50* (2013.01); *H01L 33/505* (2013.01); *F21S 45/47* (2018.01); *F21Y 2103/10* (2016.08); *F21Y 2115/10* (2016.08); *H01L 33/0095* (2013.01); *H01L 33/62* (2013.01); *H01L 2933/0025* (2013.01); *H01L 2933/0041* (2013.01)

(56) References Cited

U.S. PATENT DOCUMENTS

| | | | |
|---|---|---|---|
| 2007/0045802 A1* | 3/2007 | Chen | F21K 9/00 257/E23.061 |
| 2013/0265793 A1* | 10/2013 | Helbig | F21V 21/00 362/249.02 |
| 2014/0362573 A1* | 12/2014 | Imai | F21V 29/51 362/249.06 |
| 2015/0340567 A1 | 11/2015 | Ichikawa | |
| 2019/0035986 A1 | 1/2019 | Maeda | |
| 2019/0189857 A1 | 6/2019 | Schricker et al. | |
| 2019/0198727 A1 | 6/2019 | Shen et al. | |
| 2019/0252590 A1* | 8/2019 | Law | H01L 33/486 |

* cited by examiner

Prior Art

METHOD FOR MANUFACTURING LIGHT EMITTING ELEMENTS, LIGHT EMITTING ELEMENT, LIGHTING DEVICE AND AUTOMOTIVE HEADLAMP

CROSS REFERENCE TO RELATED APPLICATIONS

This application claims the benefit of U.S. Provisional Patent Application No. 63/149,902, which was filed on Feb. 16, 2021, the contents of which are hereby incorporated by reference herein.

BACKGROUND

Lighting devices, such as halogen lamps, have been standard light sources for automotive headlights for many years. However, recent advances in light-emitting diode (LED) technology with concomitant new design possibilities and energy efficiency have spurred interest in finding suitable replacements for halogen lamps based on LED technology, such replacements being often referred to as LED retrofit.

SUMMARY

A method for manufacturing light emitting elements is described and includes providing an un-coated light converting platelet. The un-coated light converting platelet has a top surface, a bottom surface, and side surfaces. A plurality of LED dies is provided. Side surfaces of the un-coated light converting platelet are coated with an at least partly reflective material to form a coated light converting platelet. The coated light converting platelet is separated into light converting tiles. An outline of the light converting tiles substantially corresponds to an outline of one of the plurality of LED dies. The light converting tiles and the plurality of LED dies are assembled to form light emitting elements.

BRIEF DESCRIPTION OF THE DRAWINGS

A more detailed understanding can be had from the following description, given by way of example in conjunction with the accompanying drawings wherein.

DETAILED DESCRIPTION

Figure 1:
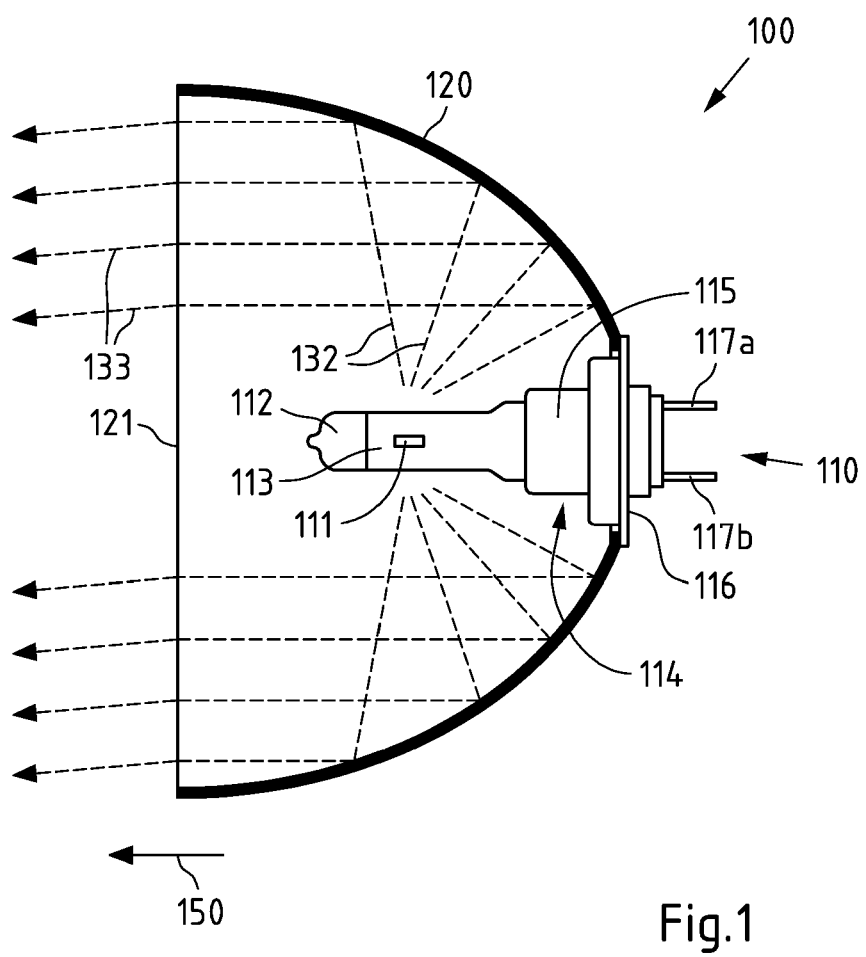
FIG. 1 illustrates a headlight with a conventional halogen lamp.

Examples of different light illumination systems and/or light emitting diode ("LED") implementations will be described more fully hereinafter with reference to the accompanying drawings. These examples are not mutually exclusive, and features found in one example may be combined with features found in one or more other examples to achieve additional implementations. Accordingly, it will be understood that the examples shown in the accompanying drawings are provided for illustrative purposes only and they are not intended to limit the disclosure in any way. Like numbers refer to like elements throughout.

It will be understood that, although the terms first, second, third, etc. may be used herein to describe various elements, these elements should not be limited by these terms. These terms may be used to distinguish one element from another. For example, a first element may be termed a second element and a second element may be termed a first element without departing from the scope of the present invention. As used herein, the term "and/or" may include any and all combinations of one or more of the associated listed items.

It will be understood that when an element such as a layer, region, or substrate is referred to as being "on" or extending "onto" another element, it may be directly on or extend directly onto the other element or intervening elements may also be present. In contrast, when an element is referred to as being "directly on" or extending "directly onto" another element, there may be no intervening elements present. It will also be understood that when an element is referred to as being "connected" or "coupled" to another element, it may be directly connected or coupled to the other element and/or connected or coupled to the other element via one or more intervening elements. In contrast, when an element is referred to as being "directly connected" or "directly coupled" to another element, there are no intervening elements present between the element and the other element. It will be understood that these terms are intended to encompass different orientations of the element in addition to any orientation depicted in the figures.

Relative terms such as "below," "above," "upper,", "lower," "horizontal" or "vertical" may be used herein to describe a relationship of one element, layer, or region to another element, layer, or region as illustrated in the figures. It will be understood that these terms are intended to encompass different orientations of the device in addition to the orientation depicted in the figures.

For LED retrofit applications, it may be advantageous if only the traditional light source, such as an incandescent light bulb, is replaced by an LED lighting device, while the remaining elements of the lamps, such as optical elements (e.g., reflector cups and lenses), do not require replacement. Hence, there are efforts to offer such retrofitting lighting devices that may represent a 1:1 replacement for traditional standard light sources, such as H7 halogen bulbs.

While LED retrofits have become popular in recent years, capabilities of LED retrofits in mimicking halogen lamps are not yet optimal. For example, differing geometries of light emission regions of halogen lamps (e.g., filament) and LED dies (e.g., light emission surfaces) may cause difficulties when LED dies are used for mimicking the light emission of a halogen lamp not only in the near field but also in the far field.

In one approach, LED retrofits may include a Copper-based support structure and/or a printed circuit board (PCB) based support structure where LEDs may be arranged on opposing sides and the tip of the support structure in order to mimic the light emission of halogen lamps. While such retrofits may provide satisfactory results for certain applications, it may not achieve a light intensity distribution mimicking a corresponding light intensity distribution of a halogen lamp that meets requirements, for example, for automotive applications, such as headlight applications.

For example, LEDs may need to be arranged in a manner representing the shape of a filament of an incandescent light source, with LEDs being arranged along an arrangement direction. Additionally, the heat transport from the LEDs may need to be effective to ensure a long lifetime of the LEDs, which may be particularly challenging as reproducing the illumination pattern of the traditional light source may require arranging multiple LEDs very close to each other. This may lead to concentration of heat within a small volume. For retrofitting applications, such as in automotive lighting, a high light output may be required, which may also lead to a high heat output of the light-emitting elements. The light-emitting elements may also have to be provided with electrical energy in an efficient manner to, for example, reduce additional heat generation in the electrical connections.

Embodiments described herein may provide a method for manufacturing light emitting elements and light emitting elements that may enable an improved capability to mimic light emission properties of a conventional halogen lamp. Embodiments described herein may also provide a lighting device that may also enable an improved capability to mimic light emission properties of a conventional halogen lamp and which may include an improved capability to cope with large heat densities. An automotive headlamp is also described herein.

FIG. 1 shows a headlight 100 with a reflector 120 to which an exemplary H7 halogen lamp 110 is mounted. A filament 111 of the halogen lamp 110 may be placed at a focus of the reflector 120 such that light 132 emitted from the filament 111 may be reflected by the reflector 120 along a main lighting direction 150. A cover 121 may incorporate suitable optics for shaping the reflected light and to form light 133 leaving the headlight 100. The Lamp 110 may include a socket 114 mounted to the reflector 120 via a mounting portion 116. Pins 117a and 117b may extend from the socket 114 for power connection. A Bulb 113 may extend from a base portion 115 surrounding filament 111 and may end in a light blocking portion 112, which may block direct light from the filament 111.

Figure 2A:
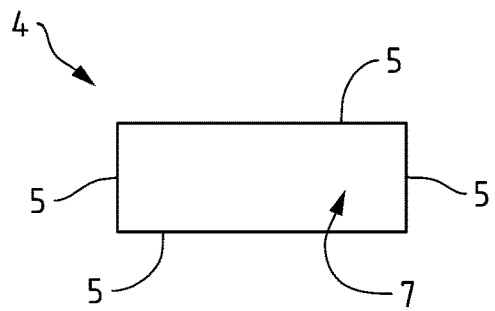
FIG. 2A is a top view of an initially un-coated light converting tile.
Figure 2B:
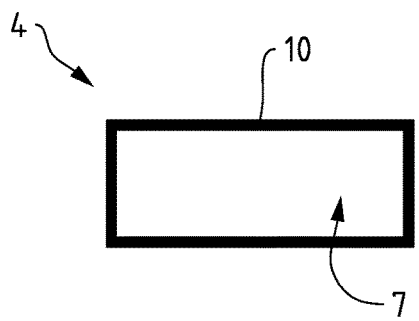
FIG. 2B is a top view of a coated light converting tile.
Figure 2C:
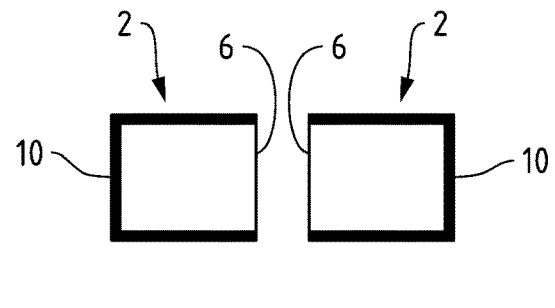
FIG. 2C is a top view of the coated light converting tile of FIG. 2B separated into individual tiles.
Figure 10:
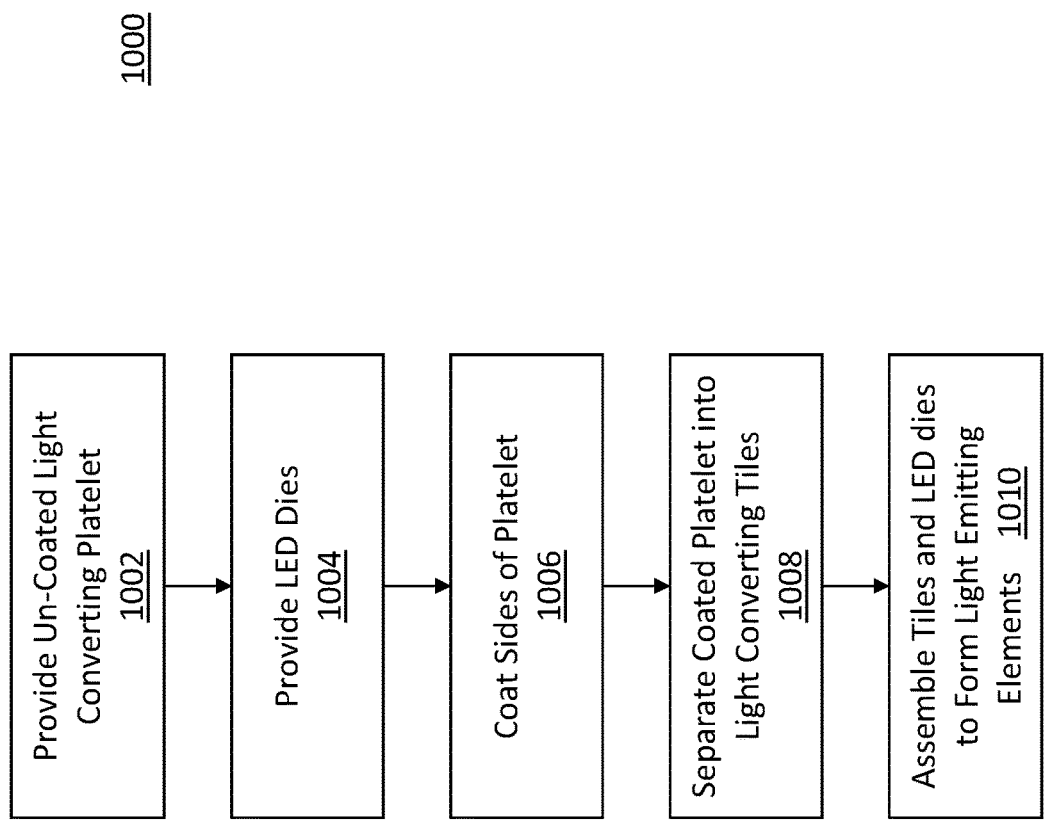
FIG. 10 is a flow diagram of an example method of manufacturing light-emitting elements.

FIG. 10 is a flow diagram of an example method 1000 of manufacturing light-emitting elements. FIGS. 2A to 2C exemplarily illustrate different steps of the method illustrated in FIG. 10. In particular, FIG. 2A is a top view of an initially un-coated light converting tile 4. FIG. 2B is a top view of a coated light converting tile 4. FIG. 2C is a top view of the coated light converting tile 4 of FIG. 2B separated into individual tiles 2.

In the example illustrated in FIG. 10, an un-coated light converting platelet may be provided (1002). An example of the un-coated light converting platelet is illustrated in FIG. 2A. In some embodiments, the uncoated platelet 4 may have been separated from a larger platelet in such a way that the outline of the uncoated and separated platelet 4 may substantially correspond to the outline of multiple of LED dies. In the example illustrated in FIG. 2A, the uncoated platelet 4 has a substantially rectangular cross section with four lateral sides 5, one top side 7 and one bottom side opposite the top side (not labeled). LED die may also be provided (1004). The LED dies are not shown in FIGS. 2A, 2B and 2C. Fully assembled light emitting elements including LED dies and coated platelets are illustrated, for example, in FIGS. 5A and 5B and described in more detail below.

The side surfaces 5 of the initially un-coated platelet 4 may be coated (1006). An example of a coated platelet 4 with a coating is illustrated in FIG. 2B. As illustrated in FIG. 2B, the sides 4 of the uncoated platelet 4 may be coated with an at least partly reflective layer 10. In the example illustrated in FIG. 2B, all sides of the uncoated platelet 4 are coated with the at least partly reflective layer 10. Any portion of the reflective layer 10 that are intentionally or unintentionally deposited on the top side 7 and/or bottom side of the platelet 4 may be removed from the top side 7 and the bottom side of the platelet 4. In some embodiments, the partly reflective layer 10 may have dichroic characteristics.

The coated platelet may be separated into individual light converting tiles (1008). An example of two individual lighting converting tiles 2 separated from the coated platelet 4 illustrated in FIG. 2B is illustrated in FIG. 2C. In the example illustrated in FIG. 2C, the coated platelet 4 is separated into two light converting tiles 2. Further, in the illustrated example, the light converting tiles 2 both comprise one lateral side 6 that does not comprise a reflective layer 10. The outline of each of the separated light converting tiles 2 may substantially correspond to the outline of at least one LED die (not shown in FIGS. 2A-2C) on which they are to be attached to form light-emitting elements.

The separated light converting tiles 2 may be attached to LED dies (shown and described below with respect to FIGS. 5A and 5B) to assemble light emitting elements. The light emitting elements, including the light emitting tiles 2, may have at least one lateral light emitting surface. In some embodiments, the assembled light emitting elements may each include at least two light emitting surfaces.

By separating the coated platelet 4 into light converting tiles, light converting tiles of light emitting elements may be provided that are partially side emitting. This may be caused by the cut sides of the light converting tiles not including the at least partly reflective layer. Hence, the light emitted by the LED dies may not only be emitted through the top side of the light converting tile but may also be emitted through at least one lateral side of the light emitting tile. The coated platelet may, for example, be separated in a sawing step. The outline of the light converting tiles may substantially corresponds to the outline of at least one LED die so that one light converting tile may be assembled with one or several LED dies in a beneficial way. The light converting and uncoated platelet 4 may, for example, be a ceramic light-converting platelet. By using a ceramic light-converting platelet, consistent emission characteristics of the light emitting elements may be provided. The light converting and uncoated platelet 4 may comprise phosphor. The separated light converting tiles 2 and the plurality of LED dies may, for example, be assembled and/or bonded to each other using an adhesive or an adhesive film. The sides of the un-coated platelet 4 may be coated by a sputtering process.

In some embodiments, the uncoated platelet 4 may be separated into multiple un-coated platelets, and the outline of the separated and un-coated platelets may substantially correspond to the outline of multiple of LED dies. The uncoated platelets 4 may be subsequently coated with an at least partly reflective layer and separated into the light converting tiles 2. Since the outline of the separated and uncoated platelets may correspond to the outline of multiple of LED dies, the coated platelets 2 may be separated and assembled with the LED dies in a beneficial way. Additionally, unused or unusable parts of the platelets may be avoided.

According to some embodiments, all sides of the initially un-coated platelet 4 may be coated with the at least partly reflective layer, and the at least partly reflective layer may be removed from the top side and/or the bottom side of the platelet (if needed). Thereby, the coating of the sides of the platelet may be performed in a beneficial manner. The reflective layer of the top side and/or the bottom side of the platelet may be removed in order to provide a permeable bottom and top side for the emitted light of the LED die. The at least partly reflective layer may be, for example, removed by grinding.

In some embodiments, the partly reflective layer may have dichroic characteristics. The reflective layer with dichroic characteristics may reflect light and prevent undesired stray light emitted by the at least one LED die from leaking out. Additionally, the partly reflective layer with dichroic characteristics may enable a close spacing of light emitting elements.

Figure 3A:
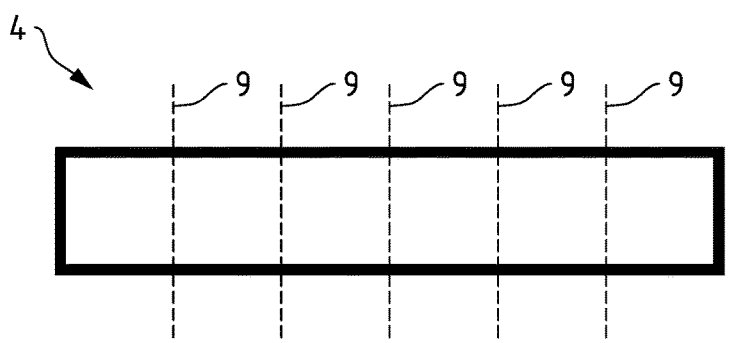
FIGS. 3A and 3B are two different examples of coated light converting platelets with different cross sections.
Figure 3B:
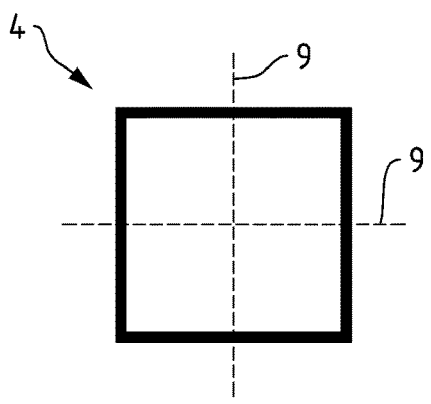

FIGS. 3A and 3B are two different examples of coated light converting platelets 4 with different cross sections. In the examples illustrated in FIGS. 3A and 3B, example cutting lines 9 are shown. The platelets 4 may be separated along the cutting lines 9 into light converting tiles 2. In the example illustrated in FIG. 3A, the coated platelet 4 has a rectangular cross section and includes 5 cutting lines 9, such that the platelet 4 can be separated into six tiles 2. In the example illustrated in FIG. 3B, the coated platelet has a square cross section and includes two cutting lines 9 that cross each other at the center of the square shaped cross section. In this way, the platelet 4 can be separated into 4 tiles. As can be seen, given that only the sides 5 of the various platelets 4 are coated, the number and arrangement of coated and un-coated surfaces of the tiles 2 may be different depending on the cross sectional shape of the platelet 4 and the arrangement of the cutting lines 9. Various cross-sectional shapes and arrangements of cutting lines 9 may be used, for example, to adapt the tiles 2 to different applications.

Figure 4:
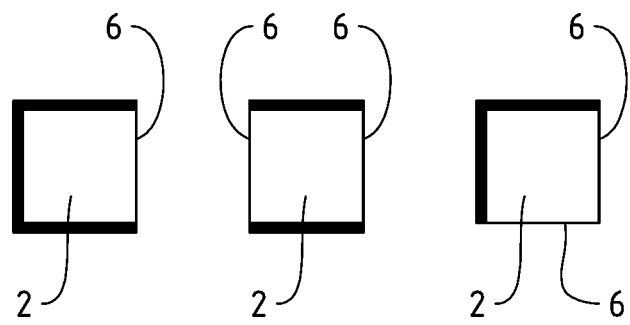
FIG. 4 is a top view of three tiles showing different configurations for the coated surfaces of the tiles.

FIG. 4 is a top view of three tiles 2 showing different configurations for the coated surfaces of the tiles 2. The light converting tile 2 shown on left of FIG. 4 has one lateral side 6 without a reflective layer 10 and may correspond, for example, to the light converting tile produced by cutting the left tile 2 of the light converting platelet 4 shown in FIG. 3A. The light converting tile 2 shown in the middle of FIG. 4 has two lateral sides 6 without a reflective layer 10 and may correspond, for example, to the light converting tiles 2 produced by cutting the middle tiles 2 shown in FIG. 3A. The light converting tile 2 shown on the right of FIG. 4 also has two lateral sides 6 without a reflective layer 10 and may correspond, for example, to the light converting tile 2 produced by cutting the upper left tile 2 shown in FIG. 3B.

Figure 5A:
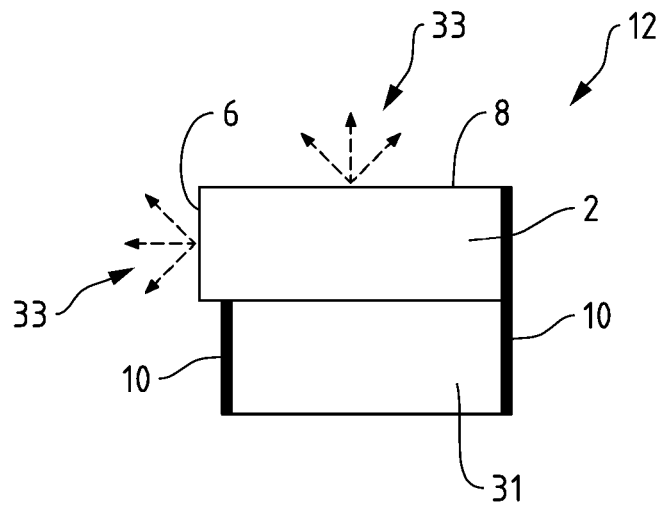
FIG. 5A is a cross-sectional view of an example light emitting element.

FIG. 5A is a cross-sectional view of an example light emitting element 12. In the example illustrated in FIG. 5A, the light emitting element 12 includes an LED die 31 and a light converting tile 2 assembled on a top side of the LED die 31. The light converting tile 2 may, for example, be glued to the LED die 31. All lateral sides of the LED die 31 may include a reflective layer 10 in order to block and/or reflect the light emitted by the LED die 31. The top side 8 and one lateral side 6 of the light converting tile 2 may not include a reflective layer 10 so that the light rays 33 may be emitted from the lateral surface 6 and the top surface 8 of the light converting tile 2. The lateral side 6 of the light converting tile 2 may extend laterally beyond the side of the LED die 31, which may further intensify the light emitted through the lateral surface 6 of the light converting tile 2. The usage of the light emitting element 12 may in particular be beneficial as first and/or second light emitting elements 12*a* and 12*b* of the lighting device 1 illustrated in FIG. 6 and described below. The lateral side of the light converting tile that extends laterally beyond the sides of the LED die may not include a reflective layer. Through the lateral extension of the light converting tile with regard to the LED die, further optimized emission characteristics of the light emitting element may be provided.

Figure 5B:
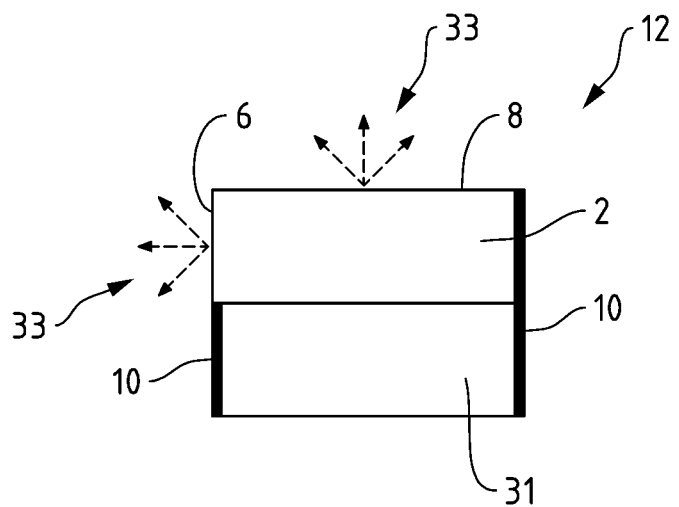
FIG. 5B is a cross-sectional view of another example light emitting element.

FIG. 5B is a cross-sectional view of another example light emitting element 12. The example illustrated in FIG. 5B differs from the light emitting element 12 shown in FIG. 5A in that the light emitting tile 2 laterally only extends as far as the reflective layer 10 on the corresponding lateral side of the LED die 31.

The surfaces or surfaces of the light emitting element on which the corresponding tile 2 does not have a corresponding reflective layer may be referred to as a light emitting surface of the light emitting element. A light emitting element may, therefore, be provided that is at least partially side emitting, which may be beneficial for the mimicking of emission characteristics of a filament of a traditional halogen lamp. In some embodiments, the light emitting element may have at least two light emitting surfaces, which may be, for example, the top side of the light converting tile 2 and one or more lateral sides of the light converting tile 2.

In some embodiments, the top side, the bottom side and at least one lateral side of the light converting tile may not include a reflective layer. In some embodiments, one to three lateral sides of the light converting tile may include a reflective layer. This may allow to emit light sideways from the light emitting element.

Figure 6:
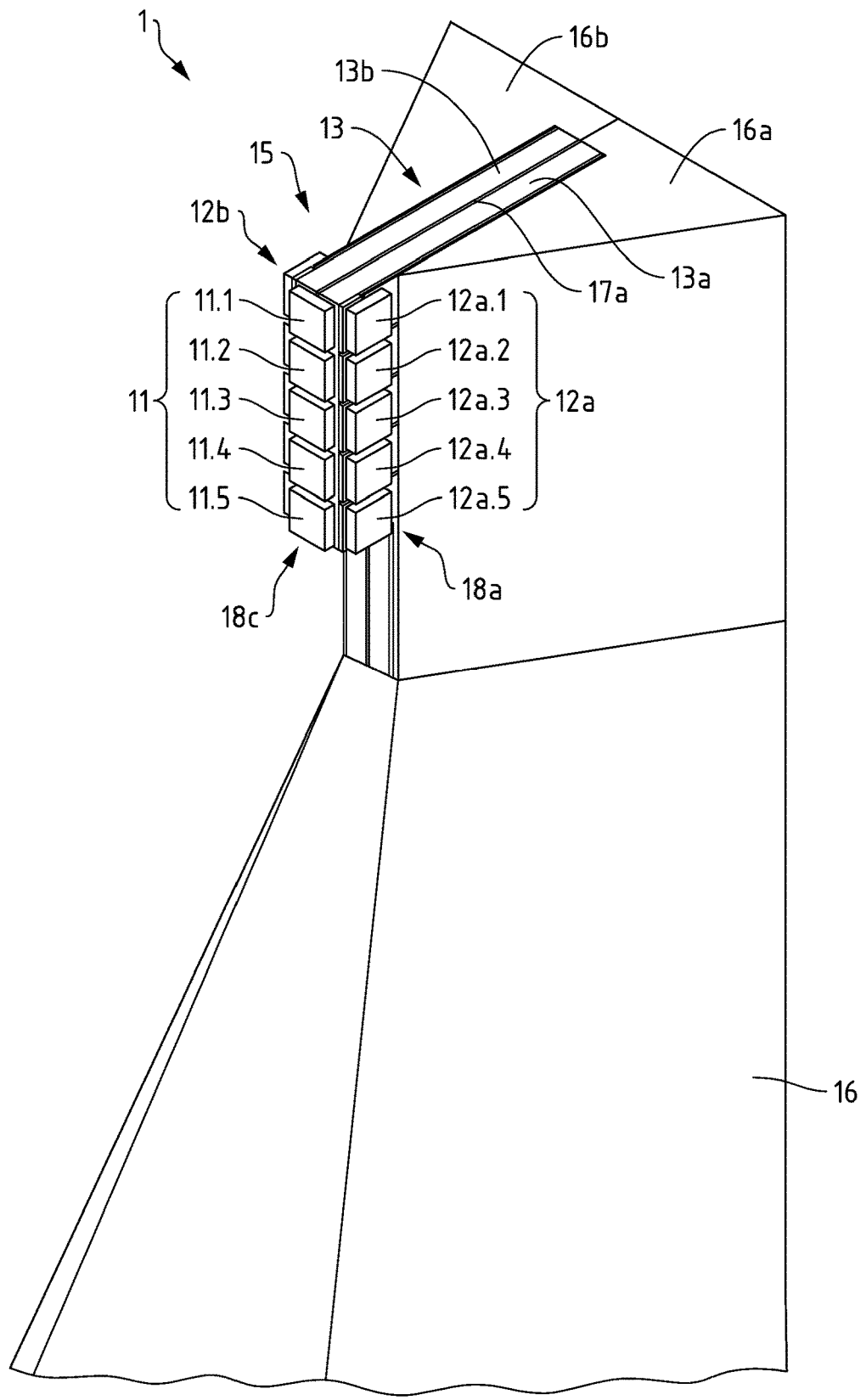
FIG. 6 is a perspective view of an example lighting device that may incorporate one or more light emitting elements, such as the light emitting elements of FIGS. 5A and 5B.

FIG. 6 is a perspective view of an example lighting device 1 that may incorporate one or more light emitting elements, such as the light emitting elements of FIGS. 5A and 5B. The lighting device 1 may be an LED retrofit including a base portion 16, which may be connected to a corresponding automotive headlight (not shown) via a socket. Replacing bulb 113 and filament 111 of FIG. 1, for example, the lighting device 1 may include a support structure 13 and arrangements 11, 12*a* and 12*b* of light emitting diodes (LEDs), which may be examples of light emitting elements. As can be taken from FIG. 6, a support structure 13 may be inserted in between sections 16*a* and 16*b* of the base portion 16 and may be formed by a first layer 13*a* and a second layer 13*b* separated by an insulating layer 17*a*. A longitudinal mounting section 15 may protrude from the support structure 13, which may include a central mounting face 18*c*. A central arrangement 11 of LEDs 11.1, 11.2, 11.3, 11.4, and 11.5 (examples of central light emitting elements) may be linearly arranged along a mounting direction on the central mounting face 18*c*. The central arrangement of LEDs may include top-emitting LEDs with one light emitting surface. Mounting section 15 may further include mutually opposing lateral mounting faces 18*a* and 18*b*, which may be arranged adjacent to and at an angle (of 90°±5°) with the central mounting face 18*c*. A lateral arrangement 12*a* of first LEDs 12a.1, 12a.2, 12a.3, 12a.4 and 12a.5 (examples of first light emitting elements) may be provided along the mounting direction on lateral mounting face 18a. A corresponding lateral arrangement 12b of LEDs provided on the opposing lateral mounting face 18b is not visible in FIG. 6 due to the perspective. The first light emitting elements 12a and the second light emitting elements 12b may comprise at least two light emitting surfaces. Thus, a filament of a halogen lamp, such as filament 111 in FIG. 1, can be advantageously mimicked by arranging the LEDs on the corresponding central and lateral mounting faces of support structure 13 as shown in FIG. 6.

Figure 7:
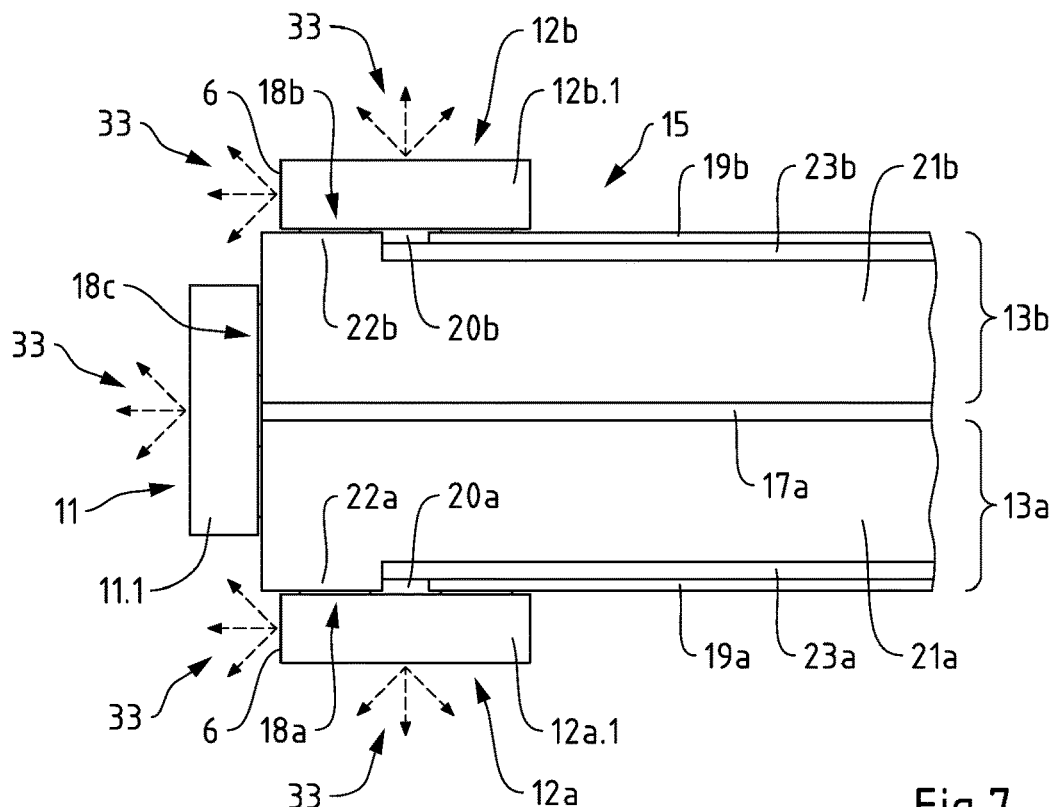
FIG. 7 is a cross-sectional view of a mounting section of the lighting device of FIG. 6.

FIG. 7 is a cross-sectional view of a mounting section of the lighting device shown in FIG. 6. In the example illustrated in FIG. 7, a first layer 13a of the support structure 13 corresponds to a single sided Insulating Metal Substrate (IMS) board that includes a first lateral conductor segment in the form of a thin contact layer 19a, a first central conductor segment in the form of a metallic base layer 21a, and a dielectric insulating layer 23a. Accordingly, the second layer 13b may correspond to a single sided IMS board that includes a second lateral conductor segment in the form of a contact layer 19b, a second central conductor segment in the form of a metallic base layer 21b and a dielectric insulating layer 23b. As shown for LED 11.1, for example, LEDs of the central arrangement 11 may be in mechanical and electrical contact with the first layer 13a, such as with the first central conductor segment 21a and with the second layer 13b, such that, on the one hand, the LEDs of central arrangement 11 may be electrically controlled, and, on the other hand, heat generated by the LEDs of arrangement 11 may be beneficially guided away by the thick base portions (e.g., layers 13a and 13b) of the respective IMS boards.

Further, as shown for the second light emitting element 12a.1, LEDs of the first lateral arrangement 12a may be in mechanical and electrical contact with the first central conductor segment 21a of the first layer 13a via a respective contact portion 22a (which may be referred to as pedestal) and may be in mechanical and electrical contact with the first lateral conductor segment 19a separated from the contact portion 22a by an air gap 20a. Similarly, as shown for second light element 12b.1, LEDs of the lateral arrangement 12b may be in mechanical and electrical contact with the second central conductor segment 21b of the second layer 13b via a respective contact portion 22b (a further pedestal) and may be in mechanical and electrical contact with the second lateral conductor segment 19b separated from the contact portion 22b by an air gap 20b. It is noted that air gaps 20a and 20b may be filled with an insulating material.

As a result of this construction, LEDs of the first and second lateral arrangements 12a and 12b may advantageously be in mechanical contact with the thicker base portions (first and second layers) 13a and 13b via the above mentioned pedestals such that beneficial heat transport may be enabled also for the lateral arrangements 12a and 12b. Thereby, on the one hand, every LED of the central and lateral arrangements 11, 12a and 12b may be connected to an efficient heat conductor for efficiently guiding away generated heat. On the other hand, a beneficially compact design may be provided by sharing the first layer 13a between the central arrangement 11 and the lateral arrangement 12a and by sharing the second layer 13b between the central arrangement 11 and the lateral arrangement 12b.

As can further be taken from FIG. 7, providing the thin contact layers 19a and 19b and contact portions 22a and 22b may enable three corresponding LEDs of the central and the lateral arrangements, for example LEDs 12a.1, 11.1 and 12b.1, to be connected in series, which may allow employing an advantageously simple controller for controlling operation of the LEDs.

The lateral sides 6, such as the lateral sides of the light converting tiles 2 of the first light emitting elements 12a and the second light emitting elements 12b, may not include a reflective layer so that the light emitting elements 12a and 12b (shown in FIG. 7 for the light emitting elements 12a.1 and 12b.1) arranged on the lateral mounting faces 18a and 18b may also emit light substantially perpendicular to the central mounting face 18c. The first light emitting elements 12a and the second light emitting elements 12b may emit light through the lateral surfaces 6 of the light converting tiles directed to the central mounting face 18c and through their top surface. The central light emitting elements 11 may emit light only through their top surface. This may enable the lighting device 1 to mimic the emission characteristics of the halogen lamp 110. The light emitted by the first light emitting elements 12a, the second light emitting elements 12b and the central light emitting elements 11 may be further illustrated through the light rays 33.

Figure 8:
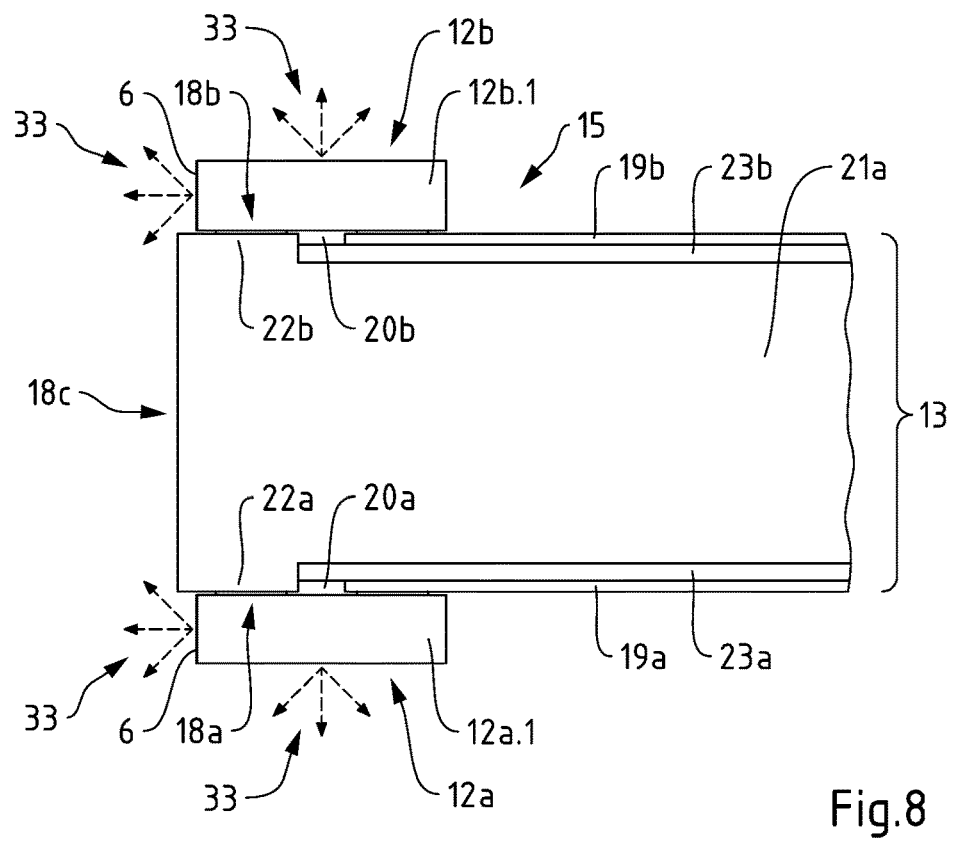
FIG. 8 is a cross-sectional view of a mounting section of another example lighting device.

FIG. 8 is a cross-sectional view of a mounting section of another example lighting device 1. In contrast to the lighting device shown in FIGS. 6 and 7, the lighting device shown in FIG. 8 does not include central light emitting elements mounted on the central mounting face 18c. Thus, first light emitting elements 12a may be arranged on the first lateral mounting face 18a and second light emitting elements 12b may be arranged on the second lateral mounting face 18b. The first light emitting elements 12a and the second light emitting elements 12b may substantially correspond to the first and the second light emitting elements 12a and 12b shown in FIGS. 6 and 7. Thus, the light emitting elements 12a and 12b may emit light in the direction of the light rays 33. The support structure 13 includes one first lateral conductor segment 19a, one first central conductor segment 21a and one second lateral conductor segment 19b. The first light emitting elements 12a may be electrically connected to the first lateral conductor segment 19a and to the first central conductor segment 21a, and the second light emitting elements 12b may be electrically connected to the first central conductor segment 21a and to the second lateral conductor segment 23b.

Figure 9:
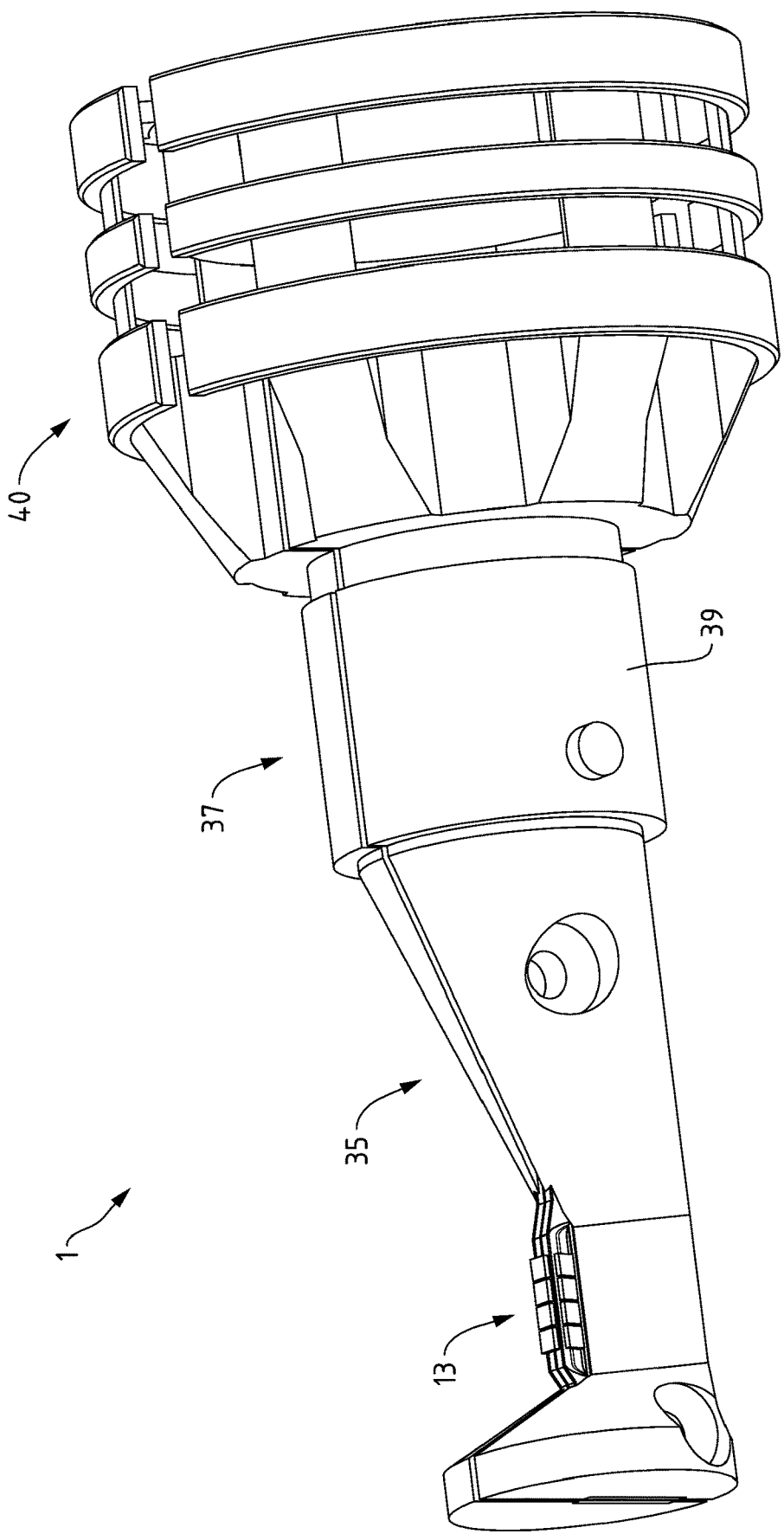
FIG. 9 is a perspective view of another example lighting device.

FIG. 9 is a perspective view of another example lighting device 1. In the example illustrated in FIG. 9, the lighting device 1 includes a head part 35 and a base part 37. The head part 35 of the lighting device 1 may include the support structure 13, including the mounting faces 18a, 18b and 18c. A heat dissipation member 39 may extend from the head part 35 to the base part 37 and may be mechanically connected to a heat sink 40 to further support transport of heat from the LEDs.

By providing light emitting elements 12 as in the embodiments described herein, side emitting elements are provided that may enable the lighting device to further mimic the emission characteristics of a halogen lamp. In this way, it is possible to meet requirements for near and far field intensity distribution that may exist, for example, in the automotive field such that a lighting device may advantageously be employed as light source for an automotive headlight. At the same time, while being highly advantageous for such application, the lighting device 1 may be suitably employed as a light source also in different applications, such as in flashlight applications, projector applications, etc.

The lighting device 1 may have at least two lateral mounting faces, which may provide a suitable mounting surface for one or more light-emitting elements. For instance, the mounting faces may be at least partially flat or planar to provide an area suitable to accommodate a light-emitting element such as an LED and/or an LED die. The mounting faces may have an arrangement direction and may be configured for accommodating at least one light-emitting element arranged along the arrangement direction. The arrangement direction may correspond to an extension direction of the mounting faces and/or the light emitting elements. For instance, the arrangement direction may correspond to a longest dimension of the mounting faces and/or the light emitting elements. The mounting faces may in particular be configured such that multiple light-emitting elements may be arranged along a line, such as a straight line, wherein the arrangement direction may correspond to the orientation of the line of light-emitting elements. In some embodiments, the at least one mounting face may be configured to accommodate (e.g., only) a single light-emitting element. Here, the light-emitting element may have, for instance, an elongated (e.g., rectangular) shape with the arrangement direction corresponding to the direction of elongation.

In embodiments, the arrangement direction may correspond to the extension direction of the filament in a halogen lamp (e.g., the longest dimension of the filament).

A body section may be arranged adjacent to the mounting faces, and the body section may be in thermal contact with the mounting faces, such that, for example, heat generated by one or more light-emitting elements mounted on the mounting faces may be transferred from the mounting faces to the body section. The body section may in particular include a volume and/or surface configured to provide heat dissipation suitable for the heat generated by light-emitting elements and to provide cooling for the light-emitting elements.

In some embodiments, the at least one first light emitting element may be in mechanical, electrical and/or thermal contact with the first lateral mounting face, and the at least one second light emitting element may be in mechanical, electrical and/or thermal contact with the second lateral mounting face.

According to some embodiments, the top sides and the central lateral sides of the light converting tiles of the at least one first light emitting element and the at least one second light emitting element may not include a reflective layer. The central lateral sides of the light converting tiles of the at least one first light emitting element and the at least one second light emitting element may be the lateral sides of the light converting tiles that point away from the extension direction of the support structure. Further, the central lateral sides may extend substantially parallel to a central mounting face or rather to an arrangement direction of the central mounting face of the support structure. The central mounting face may be formed between the first and the second lateral mounting faces. Hereby, the light emitting characteristics of the lighting device may be further adjusted to mimic the light emitting characteristics of a conventional filament.

In some embodiments, the support structure may include one metal core board, such as an insulated metal substrate (IMS) board, and the metal core board may include at least three conductive layers. It is noted that also more than one IMS-board may be employed if required or desired. The IMS-board may be a printed circuit board (PCB). The at least three conductive layers may correspond to one first lateral conductor segment, one first central conductor segment and one second lateral conductor segment.

In some embodiments, the conductive layers may correspond to a metal sheet, such as a copper sheet, cut into respective segments, for example, using a thin laser beam. The conductor segments may be attached (e.g., glued) to an insulating layer.

The at least three conductive layers may be composed of one first lateral conductor segment, one first central conductor segment and one second lateral conductor segment. The mounting face or faces may include at least two contact sections of conductive layers or conductor segments along the arrangement direction, respectively. Contact sections may, for example, be configured as contact patches or contact areas on the surface of the mounting face or faces that may allow for an electrical contact with a light-emitting element, for instance by soldering or by means of a conductive adhesive. Each contact section of the at least two contact sections may correspond to a conductor and may, therefore, be electrically connected to the body section such that, for instance, a voltage may be applied between neighboring contact sections when the body section is connected to a power source.

A voltage may be applied between any of the at least two contact sections when the body section is connected to a power source. For instance, in case of two contact sections, a voltage may be applied between those two contact sections. In case of more than two, e.g. three, contact sections, a voltage may be applied to any two of the three contact sections. For instance, a voltage may be applied between a first and second contact section, and/or between the first and a third contact section, and/or between the second and the third contact section, to name but a few non-limiting examples. Further, in case of a plurality of contact sections (e.g., at least two contact sections), it may be enabled to, for instance, apply a voltage between two different contact sections when the body section is connected to a power source. In this way, in case of a plurality of light-emitting elements being arranged on the mounting face or faces, individual combinations of the light-emitting elements may be addressed to emit light when the body section is connected to a power source.

As already mentioned above, the body section may provide an electrical connection to the mounting face or faces and may act simultaneously as a heat sink as well as a heat conductor, which may particularly be advantageous when light-emitting elements with a high heat output are used, such as LED light sources for high current applications, such as automotive head lighting.

By providing a support structure with one first lateral conductor segment, one first central conductor segment and one second lateral conductor segment, conductor segments and/or contact sections for the light emitting devices may be provided in a constructively advantageous way. The conductor segments may extend essentially perpendicular to the central mounting face.

According to some embodiments, the at least one first light emitting element may be electrically connected to the first lateral conductor segment and to the first central conductor segment, and the at least one second light emitting element may be electrically connected to the first central conductor segment and to the second lateral conductor segment. Hereby, the at least one first light emitting element and the at least one second light emitting element may be electrically connected to the conductor segments in a constructively advantageous way. As already mentioned above, it may be preferred that the conductor segments extend essentially perpendicular to the central mounting face.

In some embodiments, the support structure may be formed by essentially planar conductor segments (which may be bent one or more times in accordance with the desired usage) arranged parallel and adjacent to each other. Insulating layers, such as a dielectric insulating material, may be arranged in between the conductor segments. Using a dielectric insulating material may be beneficial, for example, in terms of corresponding properties to withstand and to conduct heat. The insulating layers may, for example, be insulating layers sandwiched by the conductive layers or conductor segments (e.g., may be arranged in direct contact with conductive layers or conductor segments). Suitable materials may include, for example, highly conductive dielectric materials like PrePreg with suitable particles, phase change sheets or resin coated copper (RCC).

According to some embodiments, a central mounting face may be formed by the support structure. At least one central light emitting element may be arranged on the central mounting face and may include (e.g., only) one light emitting surface (e.g., the top surface), making the at least one central light emitting element a top side light emitting element. The central mounting face may be arranged adjacent to the lateral mounting faces, for example, in between the lateral mounting faces. According to some embodiments, the first lateral mounting face and the second lateral mounting face may be arranged adjacent to the central mounting face, forming an angle with the central mounting face. The first lateral mounting face and the second lateral mounting face may be arranged mutually opposing.

In some embodiments, the support structure may include a second central conductor element. The at least one first light emitting element may be electrically connected to the first lateral conductor segment and to the first central conductor segment. The at least one central light emitting element may be electrically connected to the first central conductor segment and to the second central conductor segment. The at least one second light emitting element may be electrically connected to the second central conductor segment and to the second lateral conductor segment. Hereby, the at least one first light emitting element, the at least one central light emitting element and the at least one second light emitting element may be electrically connected to the conductor segments in a constructively advantageous way. As already mentioned above, the conductor segments may extend essentially perpendicular to the central mounting face. The support structure may include one metal core board, such as an insulated metal substrate, forming the conductor segments or two metal core boards (e.g., two insulated metal substrates), forming the conductor segments.

Corresponding insulation segments may be arranged between the conductor segments. In some embodiments, the central mounting face, the first lateral mounting face and the second lateral mounting face may be faces of a longitudinal mounting section protruding from the support structure.

In some embodiments, the at least one first light emitting element, the at least one central light emitting element and/or the at least one second light emitting element may be arranged on the first lateral mounting face, the central mounting face and/or the second lateral mounting face via a pick and place procedure after solder is applied to the respective mounting faces.

In some embodiments, the lighting device may include an arrangement of three to six first light emitting elements, such as four to five first light emitting elements, arranged along an arrangement direction of the first lateral mounting face, an arrangement of three to six central light emitting elements (e.g., four to five central light emitting elements) arranged along an arrangement direction of the central mounting face, and/or an arrangement of three to six second light emitting elements (e.g., four to five second light emitting elements) arranged along an arrangement direction of the second lateral mounting face. By arranging more than one light emitting element on each of the central and the two lateral mounting faces along the arrangement direction, a three-dimensional arrangement of light emitting elements may be achieved which may be optimized for mimicking the filament of an aforementioned halogen lamp.

In some embodiments, the lighting device may be a light source, such as a lamp, for example configured to be mounted to a lighting system, such as an automotive headlight. Different lighting systems may include, for example, projector systems, flashlights, reflectors and/or projector systems. In a vehicular context, typical applications may include low beam, high, beam, fog, and/or DRL applications. Being configured in this way, the lighting device may further include, for example, a suitable socket for mounting the lighting device to such lighting system. In some embodiments, a vehicle headlamp system, such as an automotive headlight including the lighting device 1, may be provided.

Figure 11:
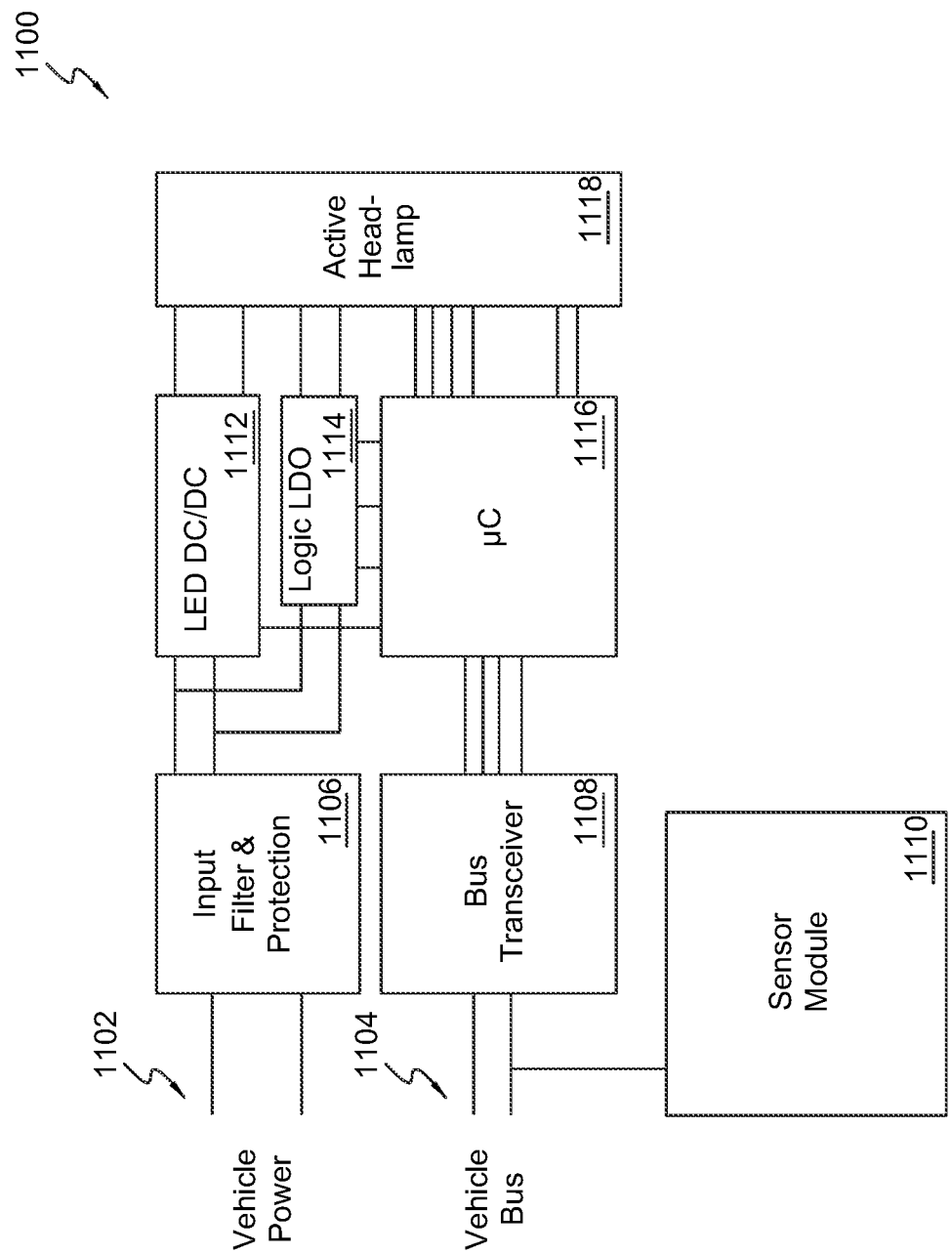
FIG. 11 is a diagram of an example vehicle headlamp system that may incorporate one or more of the embodiments and examples described herein.

FIG. 11 is a diagram of an example vehicle headlamp system 1100 that may incorporate one or more of the embodiments and examples described herein. The example vehicle headlamp system 1100 illustrated in FIG. 11 includes power lines 1102, a data bus 1104, an input filter and protection module 1106, a bus transceiver 1108, a sensor module 1110, an LED direct current to direct current (DC/DC) module 1112, a logic low-dropout (LDO) module 1114, a micro-controller 1116 and an active head lamp 1118.

The power lines 1102 may have inputs that receive power from a vehicle, and the data bus 1104 may have inputs/outputs over which data may be exchanged between the vehicle and the vehicle headlamp system 1100. For example, the vehicle headlamp system 1100 may receive instructions from other locations in the vehicle, such as instructions to turn on turn signaling or turn on headlamps, and may send feedback to other locations in the vehicle if desired. The sensor module 1110 may be communicatively coupled to the data bus 1104 and may provide additional data to the vehicle headlamp system 1100 or other locations in the vehicle related to, for example, environmental conditions (e.g., time of day, rain, fog, or ambient light levels), vehicle state (e.g., parked, in-motion, speed of motion, or direction of motion), and presence/position of other objects (e.g., vehicles or pedestrians). A headlamp controller that is separate from any vehicle controller communicatively coupled to the vehicle data bus may also be included in the vehicle headlamp system 1100. In FIG. 11, the headlamp controller may be a micro-controller, such as micro-controller (µc) 1116. The micro-controller 1116 may be communicatively coupled to the data bus 1104.

The input filter and protection module 1106 may be electrically coupled to the power lines 1102 and may, for example, support various filters to reduce conducted emissions and provide power immunity. Additionally, the input filter and protection module 706 may provide electrostatic discharge (ESD) protection, load-dump protection, alternator field decay protection, and/or reverse polarity protection.

The LED DC/DC module 1112 may be coupled between the input filter and protection module 1106 and the active headlamp 1118 to receive filtered power and provide a drive current to power LEDs in the LED array in the active headlamp 718. The LED DC/DC module 1112 may have an input voltage between 7 and 18 volts with a nominal voltage of approximately 13.2 volts and an output voltage that may be slightly higher (e.g., 0.3 volts) than a maximum voltage for the LED array (e.g., as determined by factor or local calibration and operating condition adjustments due to load, temperature or other factors).

The logic LDO module 1114 may be coupled to the input filter and protection module 1106 to receive the filtered power. The logic LDO module 1114 may also be coupled to the micro-controller 1116 and the active headlamp 1118 to provide power to the micro-controller 1116 and/or electronics in the active headlamp 1118, such as CMOS logic.

The bus transceiver 1108 may have, for example, a universal asynchronous receiver transmitter (UART) or serial peripheral interface (SPI) interface and may be coupled to the micro-controller 1116. The micro-controller 1116 may translate vehicle input based on, or including, data from the sensor module 1110. The translated vehicle input may include a video signal that is transferrable to an image buffer in the active headlamp 1118. In addition, the micro-controller 1116 may load default image frames and test for open/short pixels during startup. In embodiments, an SPI interface may load an image buffer in CMOS. Image frames may be full frame, differential or partial frames. Other features of micro-controller 1116 may include control interface monitoring of CMOS status, including die temperature, as well as logic LDO output. In embodiments, LED DC/DC output may be dynamically controlled to minimize headroom. In addition to providing image frame data, other headlamp functions, such as complementary use in conjunction with side marker or turn signal lights, and/or activation of daytime running lights, may also be controlled.

Figure 12:
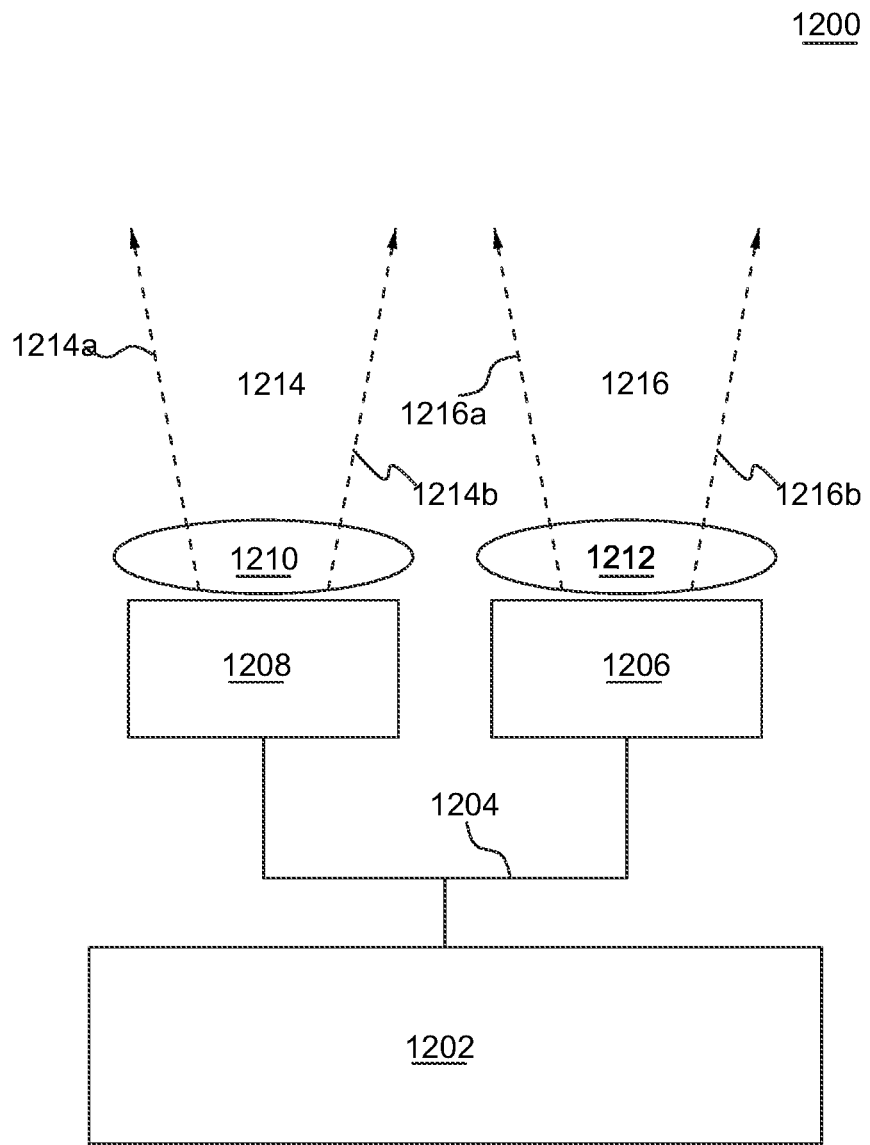
FIG. 12 is a diagram of another example vehicle headlamp system.

FIG. 12 is a diagram of another example vehicle headlamp system 1200. The example vehicle headlamp system 1200 illustrated in FIG. 12 includes an application platform 1202, two LED lighting systems 1206 and 1208, and secondary optics 1210 and 1212.

The LED lighting system 1208 may emit light beams 1214 (shown between arrows 1214a and 1214b in FIG. 12). The LED lighting system 1206 may emit light beams 1216 (shown between arrows 1216a and 1216b in FIG. 12). In the embodiment shown in FIG. 12, a secondary optic 1210 is adjacent the LED lighting system 1208, and the light emitted from the LED lighting system 1208 passes through the secondary optic 1210. Similarly, a secondary optic 1212 is adjacent the LED lighting system 1206, and the light emitted from the LED lighting system 1206 passes through the secondary optic 1212. In alternative embodiments, no secondary optics 1210/1212 are provided in the vehicle headlamp system.

Where included, the secondary optics 1210/1212 may be or include one or more light guides. The one or more light guides may be edge lit or may have an interior opening that defines an interior edge of the light guide. LED lighting systems 1208 and 1206 may be inserted in the interior openings of the one or more light guides such that they inject light into the interior edge (interior opening light guide) or exterior edge (edge lit light guide) of the one or more light guides. In embodiments, the one or more light guides may shape the light emitted by the LED lighting systems 1208 and 1206 in a desired manner, such as, for example, with a gradient, a chamfered distribution, a narrow distribution, a wide distribution, or an angular distribution.

The application platform 1202 may provide power and/or data to the LED lighting systems 1206 and/or 1208 via lines 1204, which may include one or more or a portion of the power lines 1102 and the data bus 1104 of FIG. 11. One or more sensors (which may be the sensors in the vehicle headlamp system 1200 or other additional sensors) may be internal or external to the housing of the application platform 1202. Alternatively, or in addition, as shown in the example vehicle headlamp system 1100 of FIG. 11, each LED lighting system 1208 and 1206 may include its own sensor module, connectivity and control module, power module, and/or LED array.

In embodiments, the vehicle headlamp system 1200 may represent an automobile with steerable light beams where LEDs may be selectively activated to provide steerable light. For example, an array of LEDs or emitters may be used to define or project a shape or pattern or illuminate only selected sections of a roadway. In an example embodiment, infrared cameras or detector pixels within LED lighting systems 1206 and 1208 may be sensors (e.g., similar to sensors in the sensor module 1110 of FIG. 11) that identify portions of a scene (e.g., roadway or pedestrian crossing) that require illumination.

Having described the embodiments in detail, those skilled in the art will appreciate that, given the present description, modifications may be made to the embodiments described herein without departing from the spirit of the inventive concept. Therefore, it is not intended that the scope of the invention be limited to the specific embodiments illustrated and described.

What is claimed is:

1. A light emitting element comprising:
at least one LED die comprising a top surface, a bottom surface, and side surfaces, wherein all of the side surfaces of the LED die are completely covered by an at least partly reflective layer; and
at least one light converting tile on the top surface of the LED die, the at least one light converting tile comprising a plurality of surfaces including a top surface, a bottom surface, and a plurality of side surfaces, wherein the at least partly reflective layer covers the side surfaces of the light converting tile except at least one of the plurality of side surfaces, and wherein the at least one of the plurality of side surfaces of the light converting tile that is not covered by the at least one partly reflective layer extends laterally beyond at least one of the side surfaces of the LED die.

2. The light emitting element according to claim 1, wherein the top surface and the bottom surface of the at least one light converting tile are also not covered by the at least partly reflective layer.

3. A lighting device comprising:
a support structure comprising at least one first lateral mounting face and at least one second lateral mounting face;
at least one first light emitting element on the first lateral mounting face and in contact with the support structure; and
at least one second light emitting element on the second lateral mounting face and in contact with the support structure,
the at least one first lighting element and the at least one second light emitting element comprising:
at least one LED die comprising a top surface, a bottom surface, and side surfaces, wherein all of the side surfaces of the LED die are completely covered by an at least partly reflective layer, and
at least one light converting tile on the top surface of the LED die, the at least one light converting tile comprising a plurality of surfaces including a top surface, a bottom surface and a plurality of side surfaces, wherein the at least partly reflective layer covers the side surfaces of the light converting tile except at least one of the plurality of side surfaces, and wherein the at least one of the plurality of side surfaces of the light converting tile that is not covered by the at least one partly reflective layer extends laterally beyond at least one of the side surfaces of the LED die.

4. The lighting device according to claim 3, wherein the top surfaces of the light converting tile of the at least one first light emitting element and the at least one second light emitting element are not covered by the reflective layer.

5. The lighting device according to claim 3, wherein the support structure further comprises one first lateral conductor segment, one first central conductor segment, and one second lateral conductor segment.

6. The lighting device according to claim 5, wherein the at least one first light emitting element is electrically coupled to the first lateral conductor segment and to the first central conductor segment.

7. The lighting device according to claim 6, wherein the at least one second light emitting element is electrically coupled to the first central conductor segment and to the second lateral conductor segment.

8. The lighting device according to claim 5, wherein a central mounting face is formed by the support structure.

9. The lighting device according to claim 8, further comprising at least one central light emitting element arranged on the central mounting face.

10. The lighting device according to claim 8, wherein the support structure comprises a second central conductor element, wherein the at least one first light emitting element is electrically coupled to the first lateral conductor segment and to the first central conductor segment.

11. The lighting device according to claim 9, wherein the at least one central light emitting element is electrically coupled to the first central conductor segment and to the second central conductor segment.

12. The lighting device according to claim 10, wherein the at least one second light emitting element is electrically coupled to the second central conductor segment and to the second lateral conductor segment.

13. The lighting device according to claim 3, wherein the lighting device is at least a portion of a headlamp for an automotive headlamp.

14. A light emitting element comprising:
at least one LED die comprising a top surface, a bottom surface, and side surfaces, wherein all of the side surfaces of the LED die are completely covered by an at least partly reflective layer; and
at least one light converting tile on the top surface of the LED die, the at least one light converting tile comprising a plurality of surfaces including a top surface, a bottom surface, and a plurality of side surfaces, wherein the at least partly reflective layer covers the side surfaces of the light converting tile except at least one of the plurality of side surfaces, and the at least one of the plurality of side surfaces of the light converting tile that is not covered by the at least one partly reflective layer extends to an edge of at least one of the side surfaces of the LED die.

15. The light emitting element of claim 14, wherein the top surface and the bottom surface of the at least one light converting tile are also not covered by the at least partly reflective layer.

* * * * *